US009853625B2

(12) United States Patent
Kuwahara

(10) Patent No.: US 9,853,625 B2
(45) Date of Patent: Dec. 26, 2017

(54) ACOUSTIC WAVE DEVICE, TRANSCEIVER DEVICE, AND MOBILE COMMUNICATION DEVICE

(71) Applicant: TAIYO YUDEN CO., LTD., Tokyo (JP)

(72) Inventor: Eiji Kuwahara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/795,736

(22) Filed: Jul. 9, 2015

(65) Prior Publication Data
US 2016/0142041 A1 May 19, 2016

(30) Foreign Application Priority Data

Nov. 13, 2014 (JP) .................... 2014-231115

(51) Int. Cl.
*H03H 9/70* (2006.01)
*H03H 9/72* (2006.01)
*H03H 9/05* (2006.01)

(52) U.S. Cl.
CPC .......... *H03H 9/0566* (2013.01); *H03H 9/706* (2013.01); *H03H 9/725* (2013.01)

(58) Field of Classification Search
CPC .. H03H 9/0514; H03H 9/0523; H03H 9/0557; H03H 9/0561; H03H 9/0566;
(Continued)

(56) References Cited

U.S. PATENT DOCUMENTS 5,459,368 A 10/1995 Onishi et al.
6,469,593 B2 * 10/2002 Nishizawa ........... H03H 9/0061
310/313 R
(Continued)

FOREIGN PATENT DOCUMENTS

JP 7-99420 A 4/1995
JP 10-224175 A * 8/1998
(Continued)

OTHER PUBLICATIONS

English language machine translation of JP 2005-175638 A, published Jun. 30, 2005, 6 pages.*

Primary Examiner — Barbara Summons
(74) Attorney, Agent, or Firm — Chen Yoshimura LLP

(57) ABSTRACT

An acoustic wave device includes: an acoustic wave chip including an acoustic wave element formed therein; a multilayered substrate including the acoustic wave chip mounted on an upper surface thereof; a first ground terminal formed on a lower surface of the multilayered substrate and electrically coupled to a ground electrode of the acoustic wave chip; a second ground terminal formed on the lower surface; a signal terminal formed on the lower surface and electrically coupled to a signal electrode of the acoustic wave chip; and a shield layer formed at least on the upper surface, on the lower surface, or between the lower surface and the upper surface of the multilayered substrate so as to overlap with at least a part of the acoustic wave chip, not electrically coupled to the first ground terminal in the multilayered substrate, and electrically coupled to the second ground terminal.

11 Claims, 19 Drawing Sheets

(58) Field of Classification Search
CPC .... H03H 9/0571; H03H 9/0576; H03H 9/059;
H03H 9/1078; H03H 9/1085; H03H
9/706; H03H 9/725
USPC .............. 333/133, 187–195; 310/313 R, 340
See application file for complete search history.

(56) References Cited

U.S. PATENT DOCUMENTS

| | | | |
|---|---|---|---|
| 6,756,864 B2 * | 6/2004 | Muramatsu | H03H 7/0115 333/133 |
| 7,453,333 B2 * | 11/2008 | Tanaka | H03H 9/1085 310/313 B |
| 7,941,103 B2 * | 5/2011 | Iwamoto | H03H 9/0571 333/129 |
| 8,179,211 B2 * | 5/2012 | Bauer | H03H 9/0542 333/193 |
| 2005/0264375 A1 * | 12/2005 | Ikuta | H03H 9/725 333/133 |

FOREIGN PATENT DOCUMENTS

| | | | |
|---|---|---|---|
| JP | 11-205077 A | * | 7/1999 |
| JP | 2003-273520 A | | 9/2003 |
| JP | 2005-175638 A | * | 6/2005 |

* cited by examiner

Comparative Example

Comparative Example

Comparative Example

Comparative Example

ACOUSTIC WAVE DEVICE, TRANSCEIVER DEVICE, AND MOBILE COMMUNICATION DEVICE

CROSS-REFERENCE TO RELATED APPLICATION

This application is based upon and claims the benefit of priority of the prior Japanese Patent Application No. 2014-231115, filed on Nov. 13, 2014, the entire contents of which are incorporated herein by reference.

FIELD

A certain aspect of the present invention relates to an acoustic wave device, a transceiver device, and a mobile communication device.

BACKGROUND

Mobile terminals such as mobile phones and mobile information terminals have rapidly diffused with the development of mobile communication systems. Smaller and more sophisticated mobile terminals have been developed. In addition, the number of frequency bands employed in a single mobile terminal has steadily increased due to, for example, the diffusion of Long Term Evolution (LTE). Acoustic wave devices are used for filters and duplexers provided to devices employed in the mobile terminals. As the acoustic wave device, employed is a Surface Acoustic Wave (SAW) device, a boundary acoustic wave device, or a Bulk Acoustic Wave (BAW) resonator.

Japanese Patent Application Publication No. 7-99420 discloses providing a shield layer in a substrate on which a chip including an acoustic wave element formed therein is mounted.

The provision of the shield layer in the substrate enables to reduce the leakage of a high-frequency signal from the chip. However, the shield layer and the ground of the acoustic wave chip are interconnected in the substrate in Japanese Patent Application Publication Nos. 7-99420 and 2003-273520. Thus, a high-frequency signal leaks from the chip through the ground.

SUMMARY OF THE INVENTION

According to an aspect of the present invention, there is provided an acoustic wave device including: an acoustic wave chip including an acoustic wave element formed therein; a multilayered substrate including the acoustic wave chip mounted on an upper surface of the multilayered substrate; a first ground terminal formed on a lower surface of the multilayered substrate and electrically coupled to a ground electrode of the acoustic wave chip; a second ground terminal formed on the lower surface of the multilayered substrate; a signal terminal formed on the lower surface of the multilayered substrate and electrically coupled to a signal electrode of the acoustic wave chip; and a shield layer formed at least on the upper surface of the multilayered substrate, on the lower surface of the multilayered substrate, or between the lower surface and the upper surface of the multilayered substrate so as to overlap with at least a part of the acoustic wave chip, not electrically coupled to the first ground terminal in the multilayered substrate, and electrically coupled to the second ground terminal.

According to another aspect of the present invention, there is provided a transceiver device including: a mounting board; and the above acoustic wave device, wherein the first ground terminal and the second ground terminal are individually coupled to a ground of the mounting board.

According to another aspect of the present invention, there is provided a mobile communication device including: the above transceiver device.

DETAILED DESCRIPTION

Figure 1:
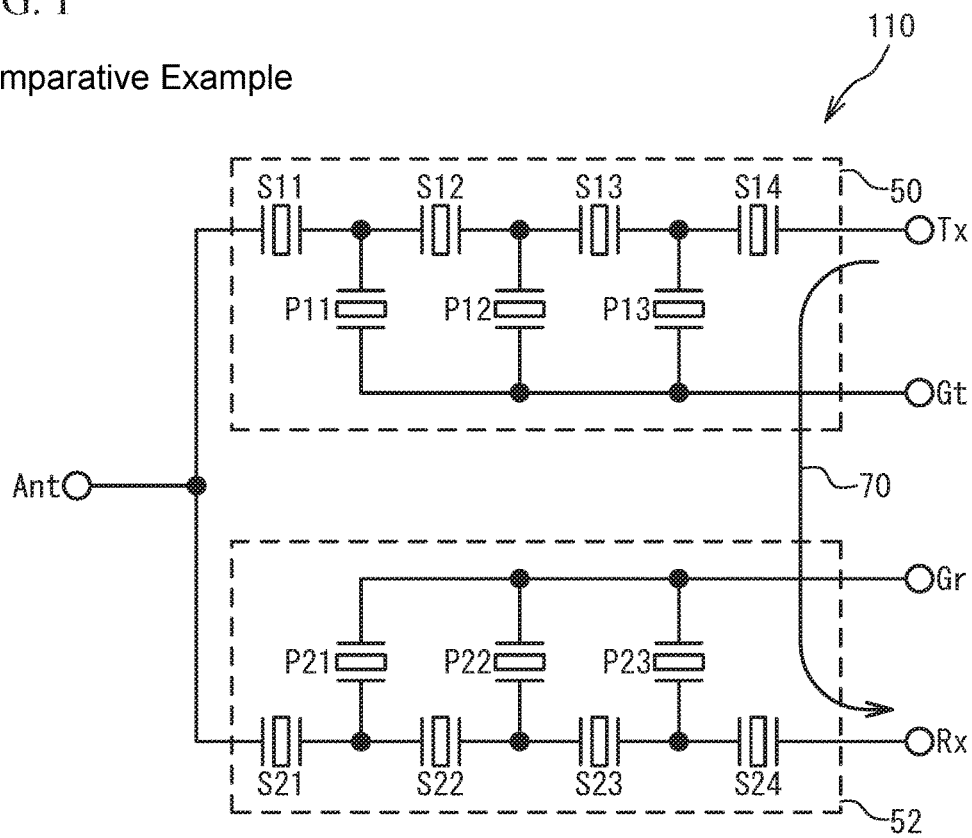
FIG. 1 is a block diagram of an acoustic wave device in accordance with a first comparative example.

A description will first be given of leakage of a high-frequency signal with use of a comparative example of a duplexer. FIG. 1 is a block diagram of an acoustic wave device in accordance with a first comparative example. As illustrated in FIG. 1, a duplexer 110 includes a transmit filter 50 and a receive filter 52. The transmit filter 50 is electrically connected between a common terminal Ant and a transmit terminal Tx. The receive filter 52 is electrically connected between the common terminal Ant and a receive terminal Rx.

The transmit filter 50 includes one or more series resonators S11 through S14 and one or more parallel resonators P11 through P13. The series resonators S11 through S14 are connected in series between the common terminal Ant and the transmit terminal Tx. The parallel resonators P11 through P13 are connected in parallel between the common terminal Ant and the transmit terminal Tx. The ground of the transmit filter 50 is coupled to a ground terminal Gt.

The receive filter 52 includes one or more series resonators S21 through S24 and one or more parallel resonators P21 through P23. The series resonators S21 through S24 are connected in series between the common terminal Ant and the receive terminal Rx. The parallel resonators P21 through P23 are connected in parallel between the common terminal Ant and the receive terminal Rx. The ground of the receive filter 52 is coupled to a ground terminal Gr.

Figure 2:
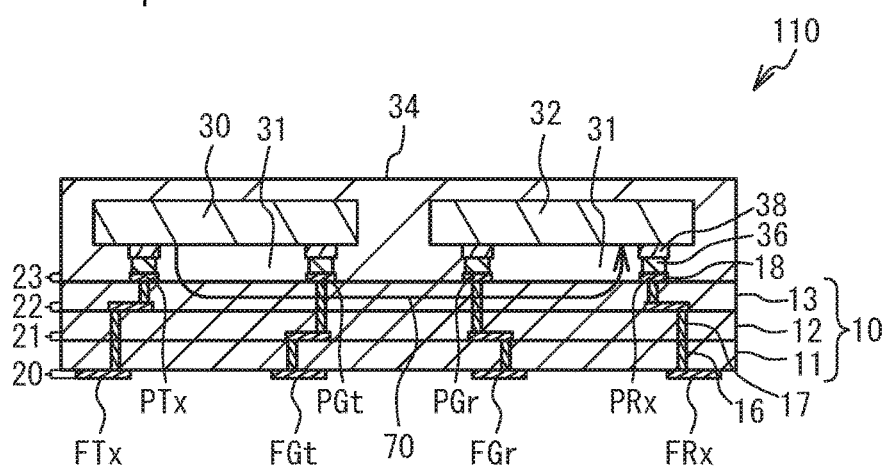
FIG. 2 is a cross-sectional view of the acoustic wave device of the first comparative example.

FIG. 2 is a cross-sectional view of the acoustic wave device of the first comparative example. As illustrated in FIG. 2, the transmit filter 50 is formed in a transmit filter chip 30, and the receive filter 52 is formed in a receive filter chip 32. The chips 30 and 32 are mounted on a multilayered substrate 10. The multilayered substrate 10 is formed by stacking layers 11 through 13. The layers 11 through 13 are insulating layers such as ceramics or a resin. A conductive layer 21 is formed on the upper side of the layer 11, a conductive layer 22 is formed on the upper side of the layer 12, and a conductive layer 23 is formed on the upper side of the layer 13. A conductive layer 20 is formed on the lower side of the layer 11. Formed are penetrating vias 16 through 18 that respectively penetrate through the layers 11 through 13. The conductive layers 20 through 23 and the penetrating vias 16 through 18 are made of a metal such as copper, gold, or aluminum. In the present description, the uppermost surface of the multilayered substrate 10 is referred to as the upper surface of the multilayered substrate 10, and the lowermost surface of the multilayered substrate 10 is referred to as the lower surface of the multilayered substrate 10. In addition, the upper surfaces of the layers 11 through 13 making up the multilayered substrate 10 are referred to as the upper sides of the layers 11 through 13, and the lower surfaces of the layers 11 through 13 are referred to as the lower sides of the layers 11 through 13.

The conductive layer 20 includes a transmit foot pad FTx, a receive foot pad FRx, a common foot pad, and ground foot pads FGt and FGr. The conductive layers 21 and 22 include lines. The conductive layer 23 includes a transmit electrode PTx, a receive electrode PRx, a common electrode, ground electrodes PGt and PGr, and a line. The illustration of the common foot pad and the common electrode is omitted. The chips 30 and 32 are mounted on the upper surface of the multilayered substrate 10. A sealing portion 34 seals the chips 30 and 32. The sealing portion 34 may not be formed on the lower surfaces of the chips 30 and 32. The lower surfaces of the chips 30 and 32 are exposed to, for example, air-spaces 31.

Figure 3A:
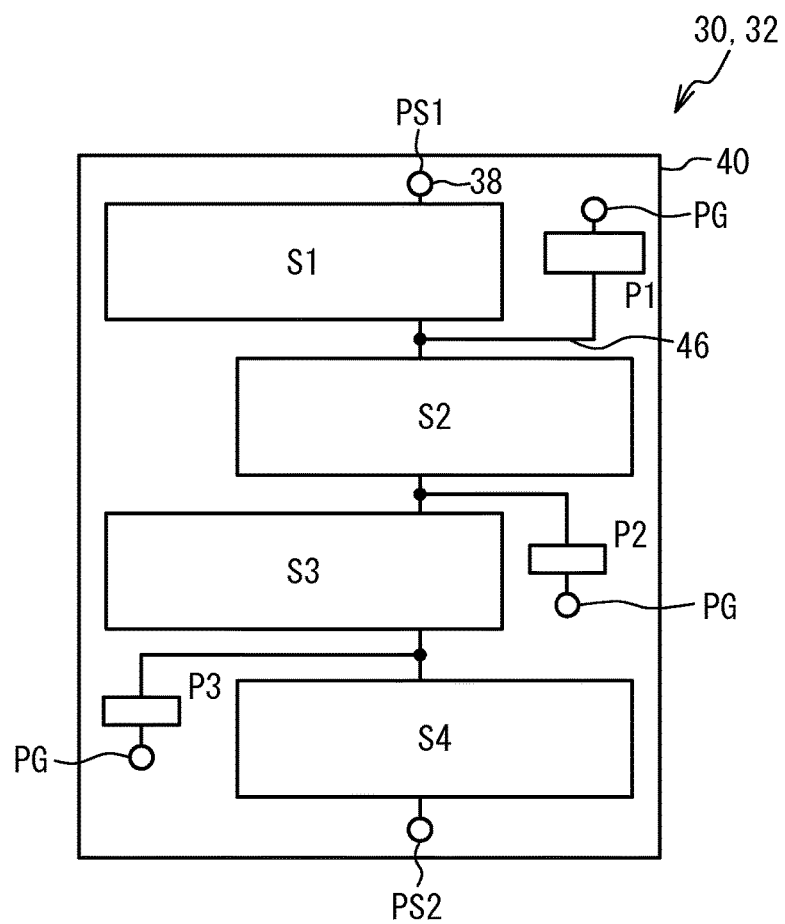
FIG. 3A is a plan view of an exemplary filter chip.
Figure 3B:
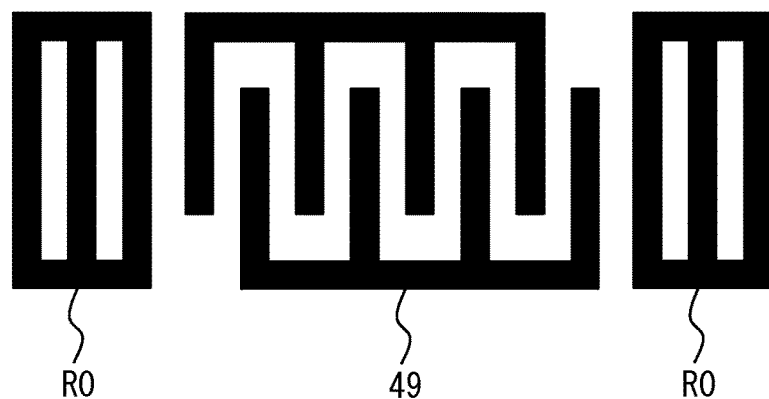
FIG. 3B is a plan view of a resonator.

FIG. 3A is a plan view of an exemplary filter chip, and FIG. 3B is a plan view of a resonator. As illustrated in FIG. 3A, series resonators S1 through S4 and parallel resonators P1 through P3, electrodes 38, and lines 46 are formed on a piezoelectric substrate 40 as acoustic wave elements. The electrodes 38 include signal electrodes PS1, PS2 and ground electrodes PG. The series resonators S1 through S4 are connected in series between the signal electrodes PS1 and PS2 through the lines 46. The parallel resonators P1 through P3 are connected between the lines 46 connecting the series resonators S1 through S4 and the ground electrodes PG. The lines 46 and the electrodes 38 are formed of a metal film such as copper.

As illustrated in FIG. 3B, the series resonators S1 through S4 and the parallel resonators P1 through P3 include an Interdigital Transducer (IDT) 49 formed on the piezoelectric substrate 40 and reflectors R0 located at the both sides of the IDT 49. The piezoelectric substrate 40 is, for example, a lithium tantalate substrate or a lithium niobate substrate. The IDT 49 and the reflectors R0 are formed of a metal film such as aluminum or copper. As described above, a surface acoustic wave resonator, a boundary acoustic wave resonator, or a Love wave resonator can be used as a resonator.

Figure 4A:
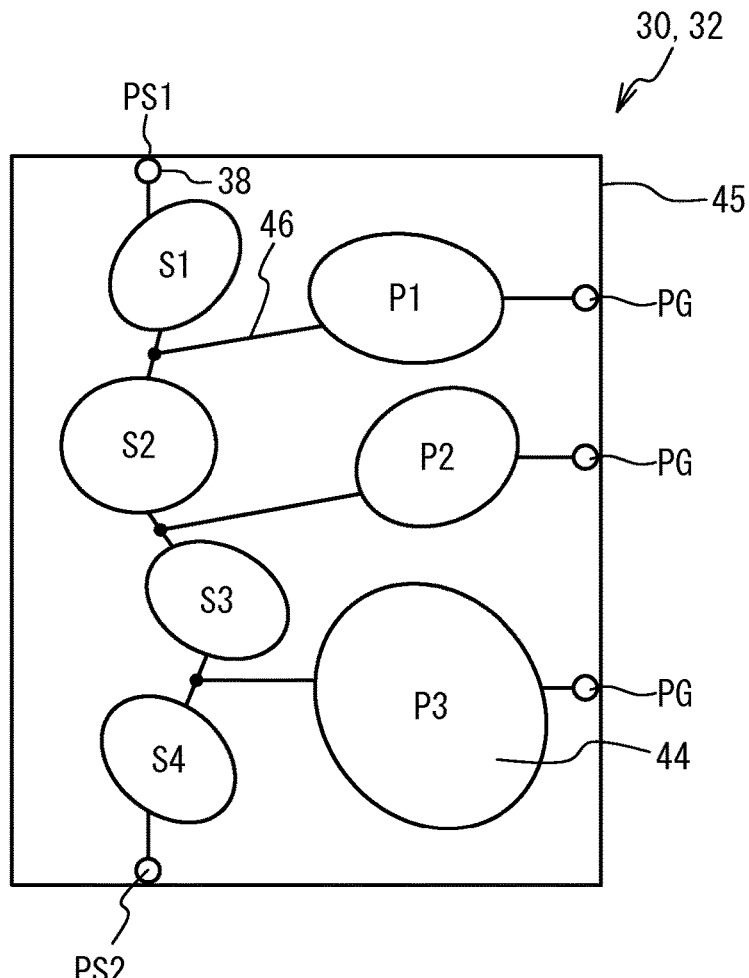
FIG. 4A is a plan view of another exemplary filter chip.
Figure 4B:
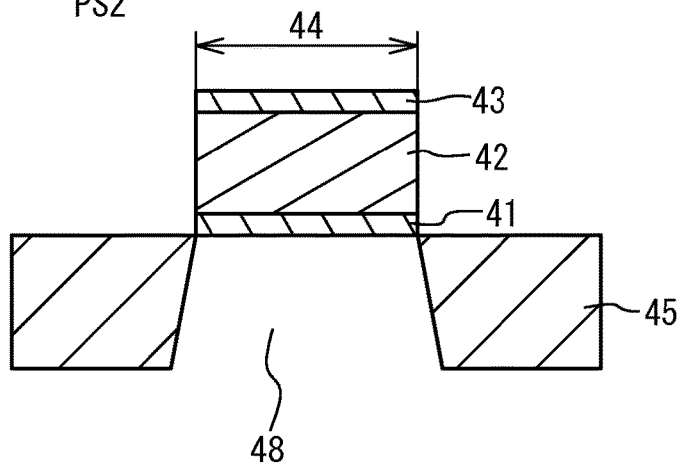
FIG. 4B is a cross-sectional view of a resonator.

FIG. 4A is a plan view of another exemplary filter chip, and FIG. 4B is a cross-sectional view of a resonator. As illustrated in FIG. 4A, on a substrate 45, formed are the series resonators S1 through S4 and the parallel resonators P1 through P3, the electrodes 38, and the lines 46. As illustrated in FIG. 4B, each of the series resonators S1 through S4 and the parallel resonators P1 through P3 includes a lower electrode 41, a piezoelectric film 42, and an upper electrode 43 formed on the substrate 45. A region where the lower electrode 41 and the upper electrode 43 face each other across the piezoelectric film 42 is a resonance region 44. The lower electrode 41 in the resonance region 44 is exposed to an air-space 48. The substrate 45 is, for example, a semiconductor substrate such as a silicon substrate or an insulating substrate such as a glass substrate. The lower electrode 41 and the upper electrode 43 are, for example, metal films such as a ruthenium film. The piezoelectric film 42 is, for example, an aluminum nitride film. Other configurations are the same as those of FIG. 3A, and thus the description is omitted.

Back to FIG. 2, the chips 30 and 32 are, for example, the filter chips illustrated in FIG. 3A or FIG. 4A. The chips 30 and 32 have dimensions of, for example, 0.7 mm×0.7 mm and a thickness of 0.15 mm. The electrodes 38 formed on the lower surfaces of the chips 30 and 32 are bonded to the conductive layer 20 on the multilayered substrate 10 by bumps 36. The transmit electrode PTx and the receive electrode PRx are bonded to the signal electrode PS1 or PS2. The ground electrodes PGt and PGr are bonded to the ground electrodes PG. The transmit foot pad FTx, the receive foot pad FRx, the ground foot pads FGt and FGr are electrically coupled to the transmit electrode PTx, the receive electrode PRx, and the ground electrodes PGt and PGr through the conductive layers 21 through 23 and the penetrating vias 16 through 18, respectively. The transmit terminal Tx, the receive terminal Rx, the common terminal Ant, and the ground terminals Gt and Gr in FIG. 1 correspond to the transmit foot pad FTx, the receive foot pad FRx, the common foot pad, and the ground foot pads FGt and FGr, respectively.

Figure 5:
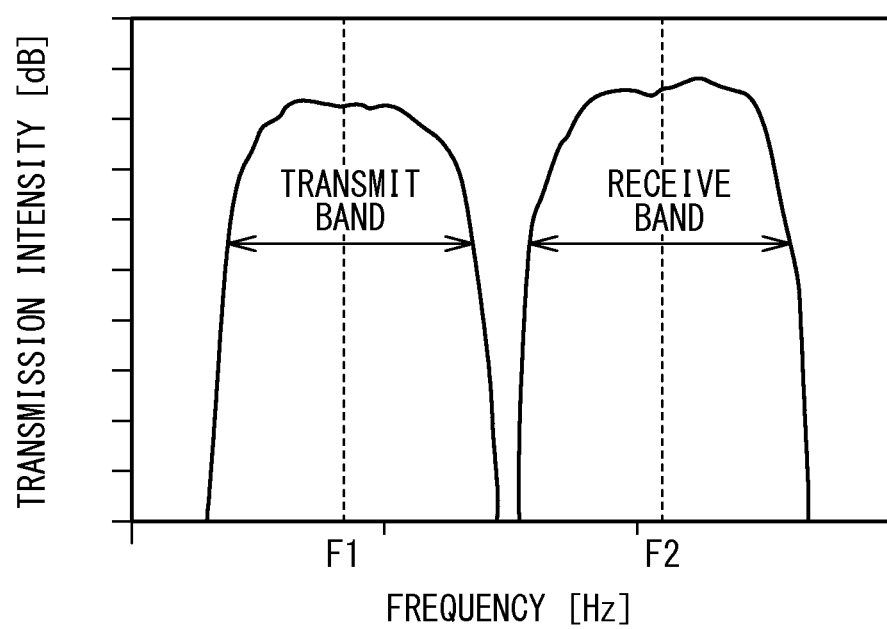
FIG. 5 is a diagram illustrating pass characteristics of a duplexer.

FIG. 5 is a diagram illustrating pass characteristics of a duplexer. The transmit filter 50 filters high-frequency signals in the transmit band from high-frequency signals supplied from the transmit terminal Tx, and outputs the filtered high-frequency signals to the common terminal Ant. The receive filter 52 filters high-frequency signals in the receive band from high-frequency signals supplied from the common terminal Ant, and outputs the filtered high-frequency signals to the receive terminal Rx. The center frequency F1 of the transmit band differs from the center frequency F2 of the receive band, and F2 is greater than F1 (F2>F1), for example. The transmit band does not overlap with the receive band.

Since the receive filter 52 has a high impedance in the transmit band, a high-frequency signal in the transmit band fails to be transmitted through the receive filter 52. However, as indicated by an arrow 70 in FIG. 1, a high-frequency signal in the transmit band may leak from the transmit terminal Tx to the receive terminal Rx. The leakage of the high-frequency signal is mainly due to the leakage of a high-frequency signal from the chip 30 to the chip 32 through an insulating material (dielectric substance) in the multilayered substrate 10 as indicated by the arrow 70 in FIG. 2. Thus, isolation characteristics from the transmit terminal to the receive terminal deteriorate. The deterioration of isolation characteristics causes a high-frequency signal leaking from a power amplifier located anterior to the transmit terminal Tx to create distortion and/or interfere with a reception signal as a noise in a low noise amplifier located posterior to the receive terminal Rx. Therefore, the receiving sensitivity deteriorates, and satisfactory communication is disturbed.

Figure 6:
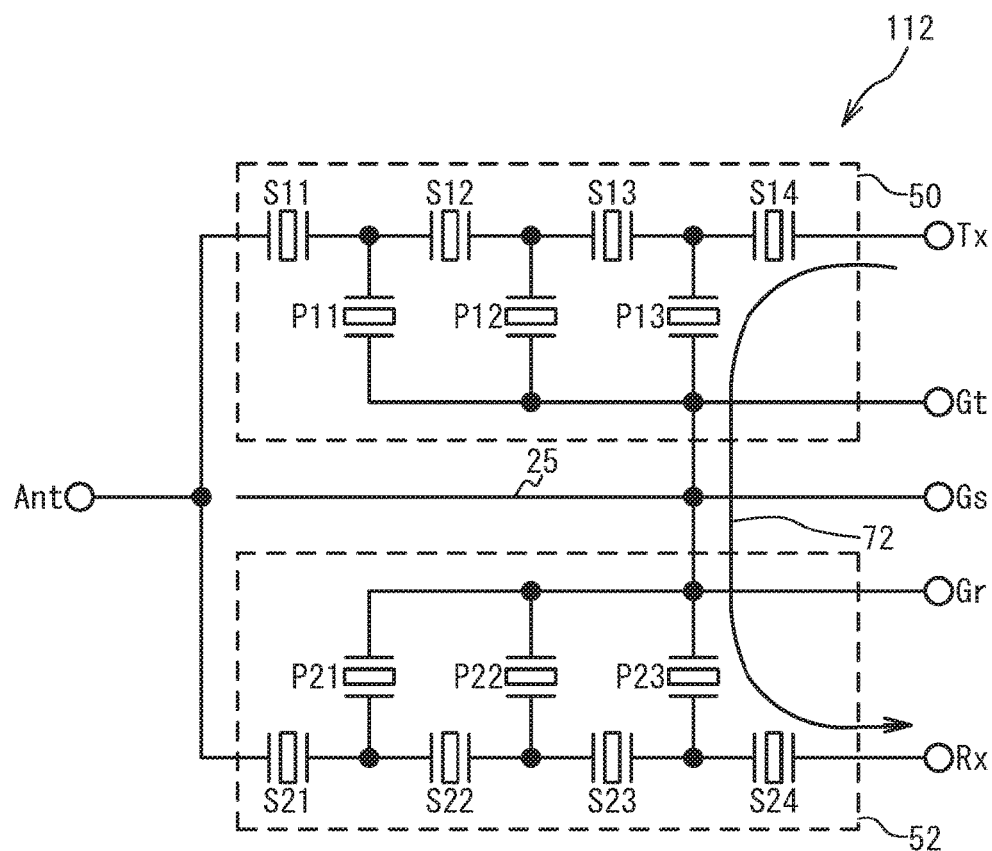
FIG. 6 is a block diagram of an acoustic wave device in accordance with a second comparative example.

A description will be given of a second comparative example that reduces the leakage of the high-frequency signal in the first comparative example. FIG. 6 is a block diagram of an acoustic wave device in accordance with the second comparative example. As illustrated in FIG. 6, in a duplexer 112, a shield layer 25 is located between the transmit filter 50 and the receive filter 52. The shield layer 25 is electrically coupled to a ground terminal Gs.

Figure 7:
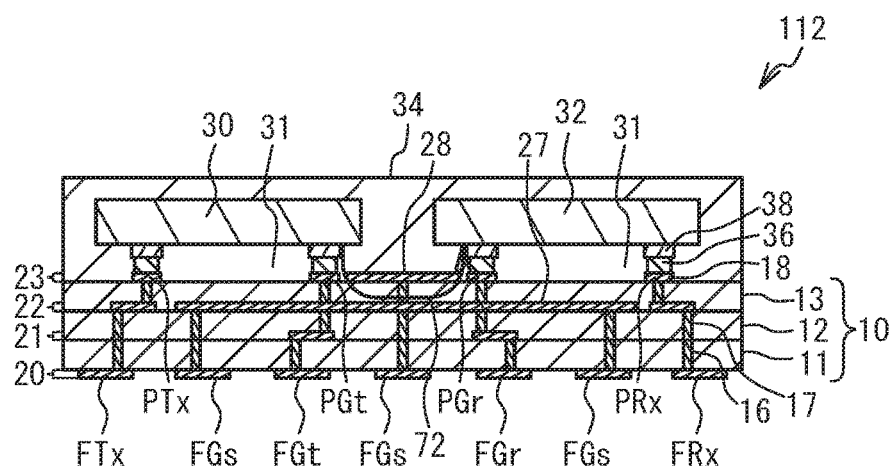
FIG. 7 is a cross-sectional view of the acoustic wave device of the second comparative example.

FIG. 7 is a cross-sectional view of the acoustic wave device of the second comparative example. As illustrated in FIG. 7, a shield layer 27 is located on the upper side of the layer 12, and a shield layer 28 is located on the upper side of the layer 13. The shield layers 27 and 28 are electrically coupled to ground foot pads FGs through the penetrating vias 16 through 18. The ground electrodes PGt and PGr, and the ground foot pads FGt and FGr that correspond to ground terminals are electrically coupled to the shield layers 27 and 28 through the penetrating vias 16 through 18. Other structures are the same as those of the first comparative example, and thus the description is omitted. Supplying the shield layers 27 and 28 with a reference electric potential such as a ground potential enables to reduce the leakage of a high-frequency signal from the chip 30 to the chip 32 through the insulating material of the multilayered substrate 10.

However, in the second comparative example, the grounds of the chips 30 and 32 are electrically coupled to the shield layers 27 and 28 in the multilayered substrate 10. When via wirings between the shield layers 27 and 28 and the ground foot pad FGs are equivalent to an inductor, the shield layers 27 and 28 are not strongly grounded. Thus, as indicated by arrows 72 in FIG. 6 and FIG. 7, a high-frequency signal leaks from the ground of the chip 30 to the ground of the chip 32 through the shield layers 27 and 28.

A description will now be given of embodiments that reduce the leakage of a high-frequency signal from the chip 30 to the chip 32.

First Embodiment

Figure 8:
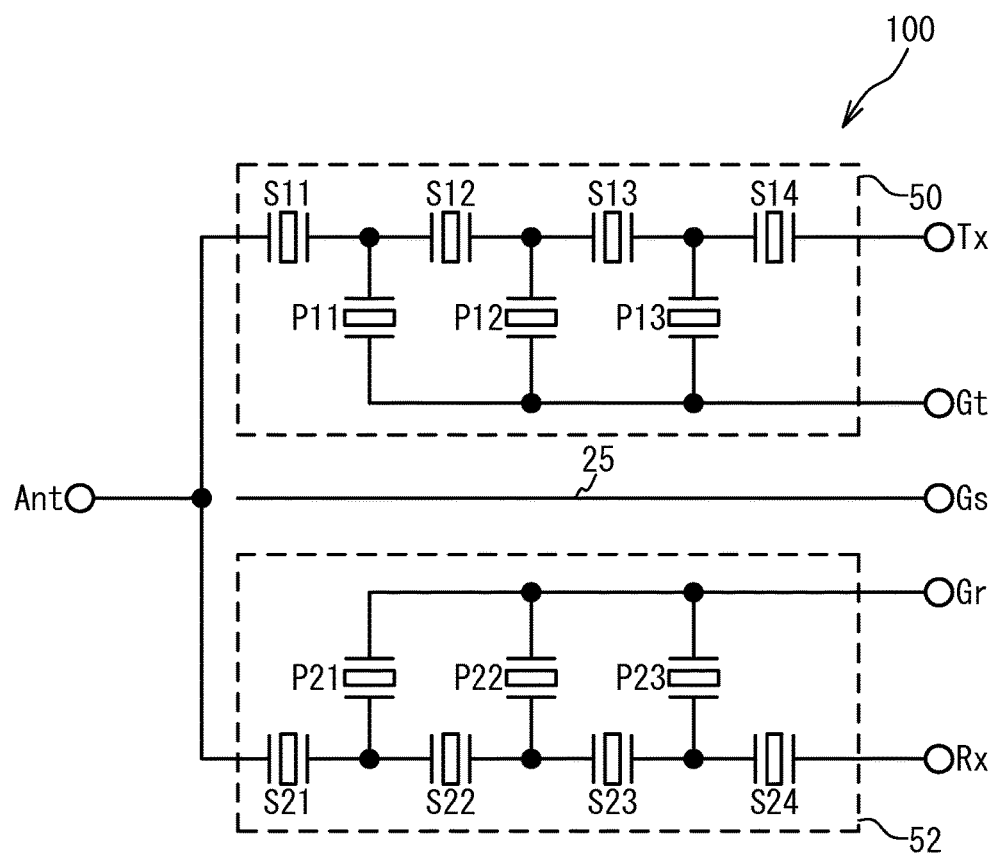
FIG. 8 is a block diagram of an acoustic wave device in accordance with a first embodiment.

FIG. 8 is a block diagram of an acoustic wave device in accordance with a first embodiment. As illustrated in FIG. 8, in a duplexer 100, the ground of the transmit filter 50 is electrically coupled to the first ground terminal Gt without electrically connecting to the shield layer 25 and the second ground terminal Gs. The ground of the receive filter 52 is electrically coupled to the first ground terminal Gr without electrically connecting to the shield layer 25 and the second ground terminal Gs. In the acoustic wave device, the first ground terminal Gt and the ground terminal Gr are not electrically coupled to the second ground terminal Gs.

Figure 9A:
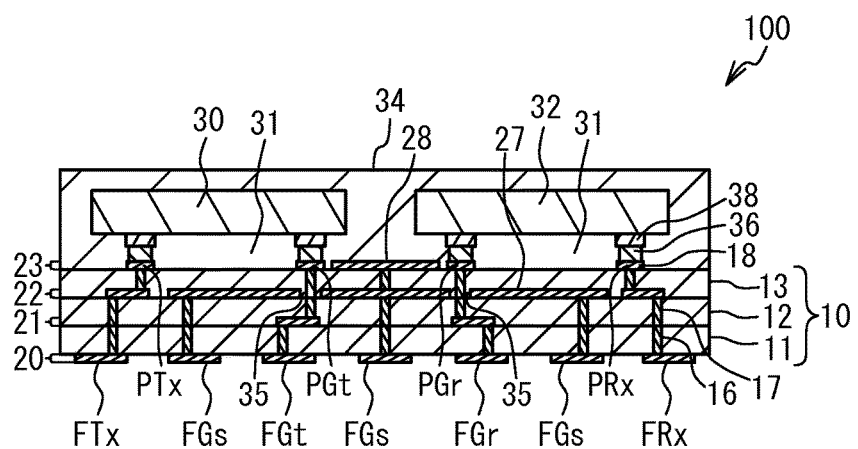
FIG. 9A is a cross-sectional view of the acoustic wave device of the first embodiment.

FIG. 9A is a cross-sectional view of the acoustic wave device of the first embodiment. As illustrated in FIG. 9A, apertures 35 are formed in the shield layer 27, and the ground electrodes PGt and PGr are coupled to the ground foot pads FGt and FGr without electrically making contact with the shield layer 27. Other structures are the same as those of the first and second comparative examples, and thus the description is omitted.

Figure 9B:
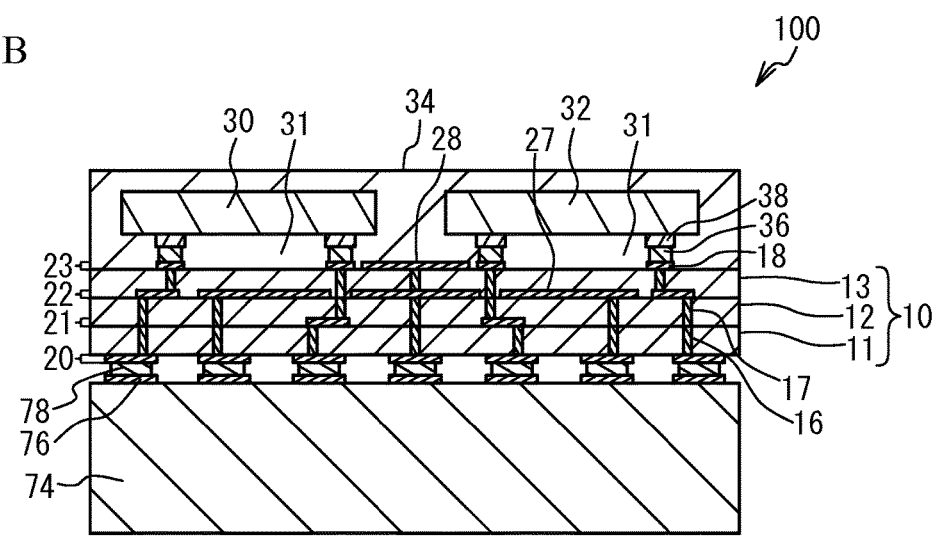
FIG. 9B is a cross-sectional view illustrating the acoustic wave device of the first embodiment mounted on a mounting board.

FIG. 9B is a cross-sectional view illustrating the acoustic wave device of the first embodiment mounted on a mounting board. As illustrated in FIG. 9B, the duplexer 100 is mounted on a mounting board 74. Terminals 76 are located on the upper surface of the mounting board 74. The foot pads of the duplexer 100 are bonded to the terminals 76 by solder 78. The mounting board 74 is, for example, a mother board or a daughter board. The ground foot pads FGt and FGr, which correspond to a first ground terminal, and the ground foot pad FGs, which corresponds to a second ground terminal, are individually coupled to a ground in the mounting board 74.

In the first embodiment, the grounds of the transmit filter 50 and the receive filter 52 are not electrically coupled to the shield layer 25 (the shield layers 27 and 28 in FIG. 9A) in the multilayered substrate 10 or in the acoustic wave device (the duplexer 100). This configuration enables to reduce the leakage of a high-frequency signal from the transmit filter 50 to the ground of the receive filter 52 through the shield layer 25. Therefore, the isolation characteristics are improved.

Figure 10A:
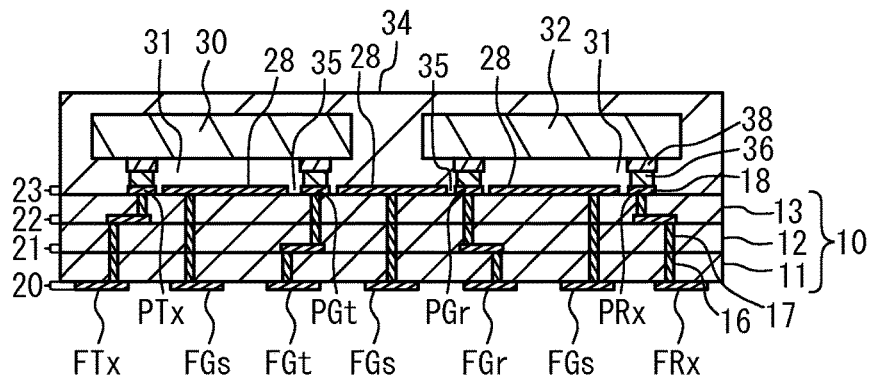
FIG. 10A through FIG. 10C are cross-sectional views of duplexers in accordance with first through third variations of the first embodiment, respectively.
Figure 10B:
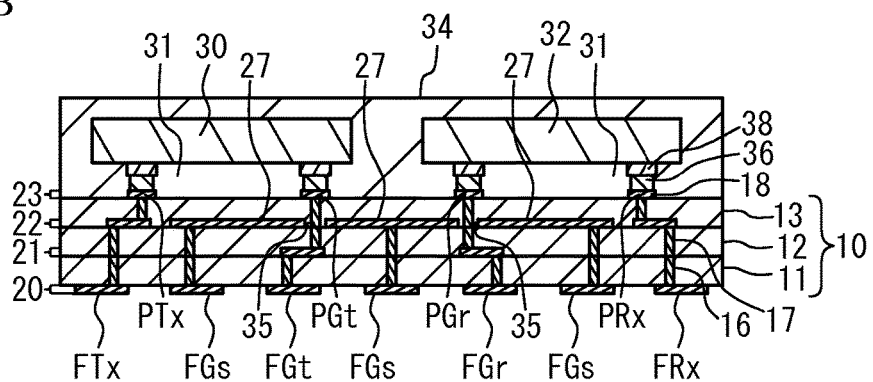
Figure 10C:
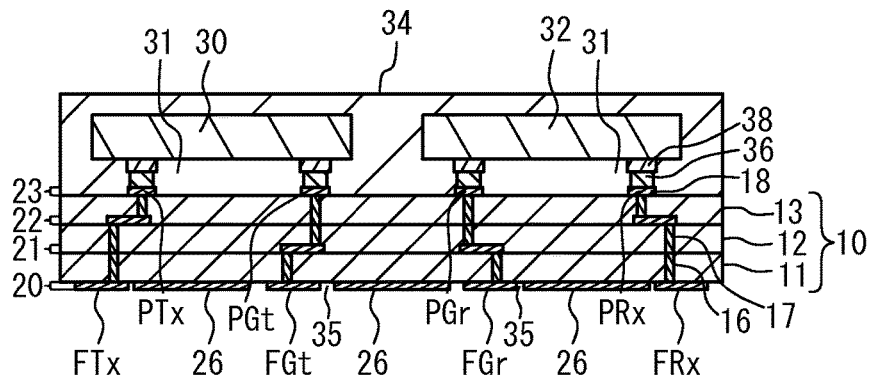

FIG. 10A through FIG. 10C are cross-sectional views of duplexers in accordance with first through third variations of the first embodiment. As illustrated in FIG. 10A, the shield layer 28 is located in the conductive layer 23 on the upper surface of the multilayered substrate 10, and is not located in the conductive layers 20 through 22. The apertures 35 are formed in the conductive layer 23. The ground electrodes PGt and PGr are formed in the apertures 35. As illustrated in FIG. 10B, the shield layer 27 is located in the inner conductive layer 22 not exposed from the multilayered substrate 10, and is not located in the conductive layer 20, 21, or 23. The apertures 35 are formed in the conductive layer 22. The lines electrically connecting the ground electrodes PGt and PGr to the ground foot pads FGt and FGr are formed in the apertures 35. As illustrated in FIG. 10C, a shield layer 26 is located in the conductive layer 20 on the lower surface of the multilayered substrate 10, and is not located in the conductive layers 21 through 23. The apertures 35 are formed in the conductive layer 20. The ground foot pads FGt and FGr are formed in the apertures 35. When the shield layer 26 is located on the lower surface of the multilayered substrate 10, the ground foot pad FGs and the shield layer 26 may be interconnected by a line, or at least a part of the shield layer 26 may be used as the ground foot pad FGs. Other structures are the same as those of the first embodiment, and thus the description is omitted.

Figure 11A:
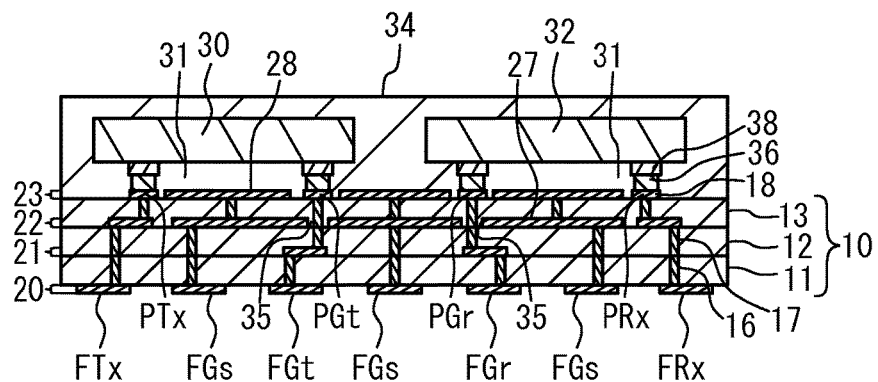
FIG. 11A through FIG. 11C are cross-sectional views of duplexers in accordance with fourth through sixth variations of the first embodiment, respectively.
Figure 11B:
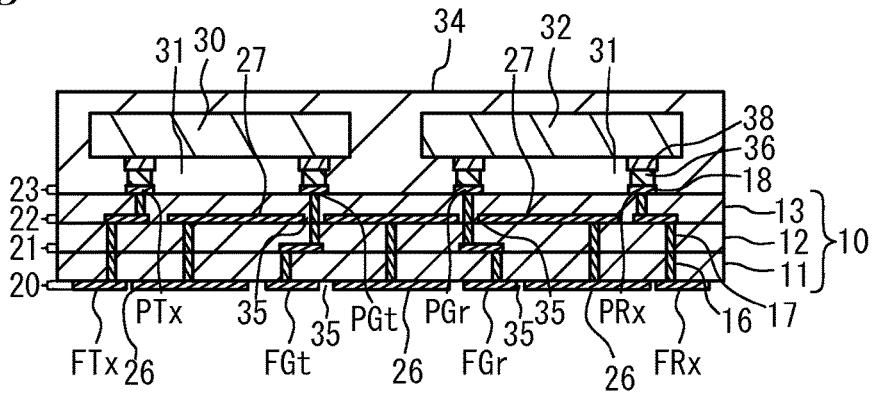
Figure 11C:
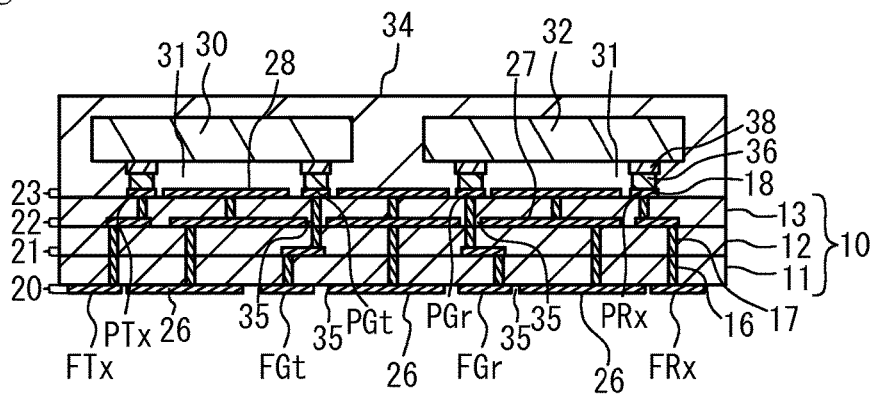

FIG. 11A through FIG. 11C are cross-sectional views of duplexers in accordance with fourth through sixth variations of the first embodiment. As illustrated in FIG. 11A, the shield layer 27 is located in the conductive layer 22 inside the multilayered substrate 10, and the shield layer 28 is located in the conductive layer 23 on the upper surface of the multilayered substrate 10. As illustrated in FIG. 11B, the shield layer 26 is located in the conductive layer 20 on the lower surface of the multilayered substrate 10, and the shield layer 27 is located in the conductive layer 22 inside the multilayered substrate 10. As illustrated in FIG. 11C, the shield layer 26 is located in the conductive layer 20 on the lower surface of the multilayered substrate 10, the shield layer 27 is located in the conductive layer 22 inside the multilayered substrate 10, and the shield layer 28 is located in the conductive layer 23 on the upper surface of the multilayered substrate 10. Other structures are the same as those of the first embodiment and its first through third variations, and thus the description is omitted.

As described in the first through third variations of the first embodiment, the shield layer may be formed in one conductive layer of the conductive layers 20 through 23. As described in the fourth through sixth variations of the first embodiment, the shield layer may be formed in more than one conductive layer of the conductive layers 20 through 23, or may be located in all conductive layers.

Figure 12A:
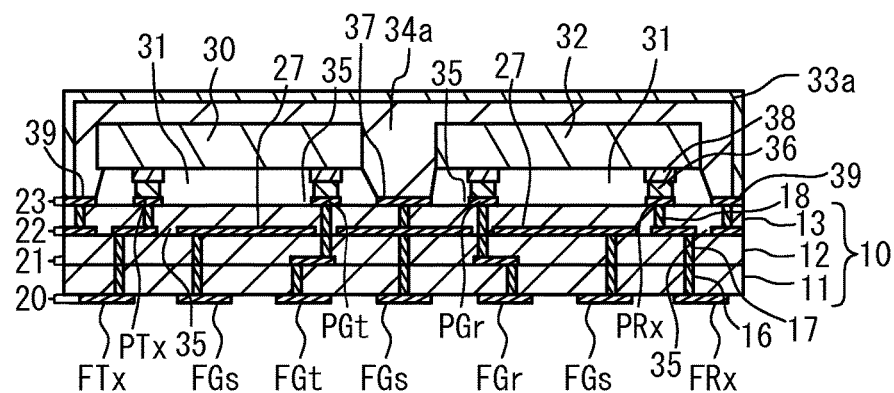
FIG. 12A and FIG. 12B are cross-sectional views of duplexers in accordance with seventh and eighth variations of the first embodiment, respectively.
Figure 12B:
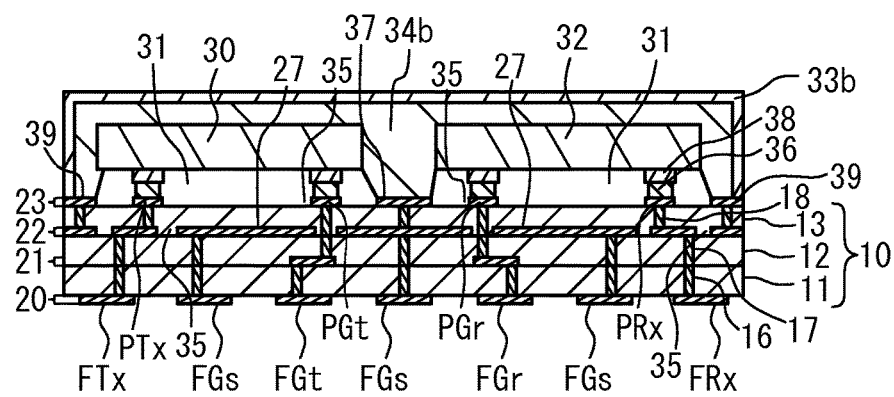

FIG. 12A and FIG. 12B are cross-sectional views of duplexers in accordance with seventh and eighth variations of the first embodiment. As illustrated in FIG. 12A, a sealing portion 34a is made of a metal such as solder. On the multilayered substrate 10, located are an interchip electrode 37 and a circular electrode 39 formed from the conductive layer 23. The interchip electrode 37 is formed between the chips 30 and 32. The circular electrode 39 is formed in a circular shape so as to surround the chips 30 and 32. The sealing portion 34a makes contact with and is electrically coupled to the interchip electrode 37 and the circular electrode 39. The sealing portion 34a seals the chips 30 and 32 so that the lower surfaces of the chips 30 and 32 and the bumps 36 are exposed to the air-spaces 31. A cover film 33a is formed to cover the sealing portion 34a. The cover film 33a is a metal film such as a nickel film or an insulating film such as a silicon oxide film. The interchip electrode 37 and the circular electrode 39 are electrically coupled to the ground foot pad FGs through the shield layer 27. The sealing portion 34a is thereby not electrically coupled to the ground foot pad FGr or FGt in the multilayered substrate 10. Other structures are the same as those of the second variation of the first embodiment, and thus the description is omitted.

As illustrated in FIG. 12B, a sealing portion 34b is an insulating material such as a resin. A cover film 33b is formed to cover the sealing portion 34b. The cover film 33b is a metal film such as a gold film. The cover film 33b is electrically coupled to the circular electrode 39. Other structures are the same as those of the seventh variation of the first embodiment, and thus the description is omitted.

As described in the fourth through sixth variations of the first embodiment, the formation of the shield layers in more than one conductive layer enables to further reduce the leakage of a high-frequency signal from the filter chip through the ground. In addition, as described in the seventh and eighth variations of the first embodiment, the sealing portion 34a or the cover film 33b may be electrically coupled to the shield layer in the multilayered substrate 10. This structure prevents the filter chip 30 from interfering with the sealing portion 34a or the cover film 33b through the ground.

Figure 13:
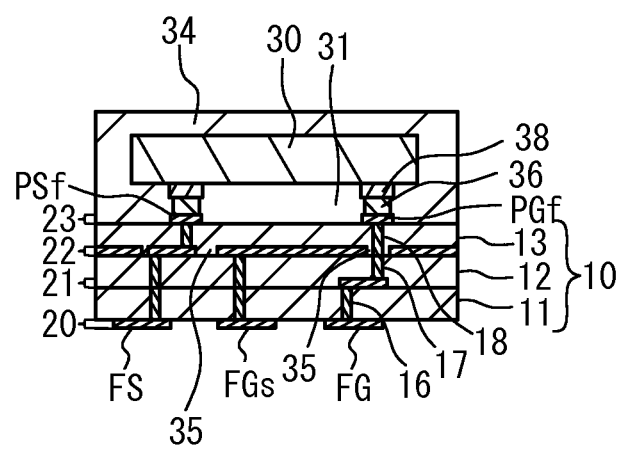
FIG. 13 is a cross-sectional view of a filter in accordance with a ninth variation of the first embodiment.

FIG. 13 is a cross-sectional view of a filter in accordance with a ninth variation of the first embodiment. As illustrated in FIG. 13, the filter chip 30 is flip-chip mounted on the multilayered substrate 10. The filter chip 30 is, for example, the filter chip illustrated in FIG. 3A or FIG. 4A. A signal electrode PSf and a ground electrode PGf are located in the conductive layer 23. The signal electrode PS1 or PS2 of the filter chip 30 is bonded to the signal electrode PSf by the bump 36. The ground electrode PG of the filter chip 30 is bonded to the ground electrode PGf by the bump 36. The signal electrode PSf is electrically coupled to a signal foot pad FS. The ground electrode PGf is electrically coupled to the ground foot pad FG. Other structures are the same as those of the second variation of the first embodiment, and thus the description is omitted.

In the ninth variation of the first embodiment, the shield layer 27 is electrically separated from the ground of the filter chip 30 in the multilayered substrate 10. This structure enables to reduce the leakage of a high-frequency signal from the filter chip 30 through the ground. Thus, the variation of the characteristics of the filter chip 30 due to the leakage of a high-frequency signal can be reduced.

Figure 14A:
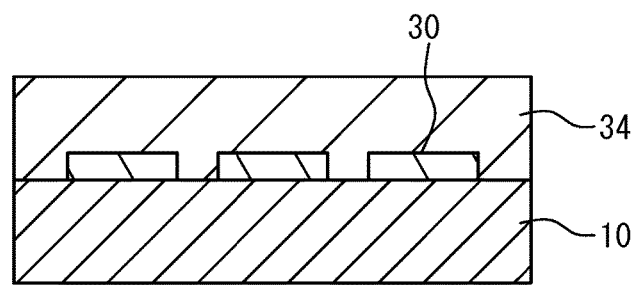
FIG. 14A through FIG. 14C are schematic cross-sectional views illustrating tenth through twelfth variations of the first embodiment, respectively.
Figure 14B:
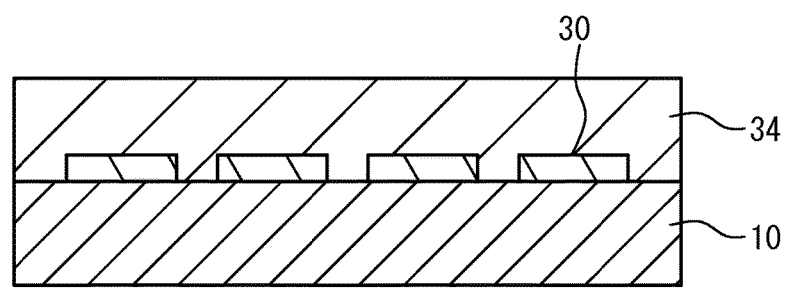
Figure 14C:
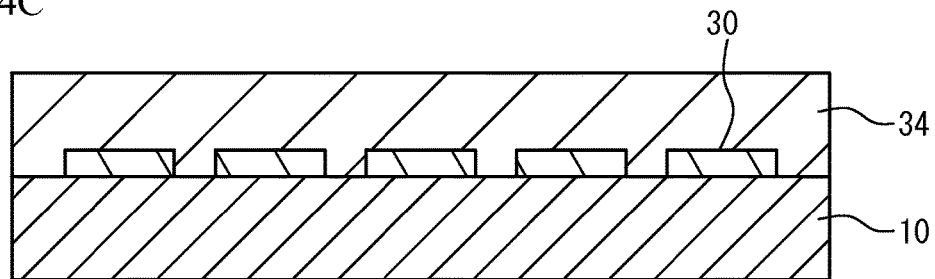

FIG. 14A through FIG. 14C are schematic cross-sectional views illustrating tenth through twelfth variations of the first embodiment. The details of the multilayered substrate, the sealing portion, and the like are not illustrated. As illustrated in FIG. 14A, a triplexer of the tenth variation of the first embodiment includes three filter chips 30 mounted on the upper surface of the multilayered substrate 10. As illustrated in FIG. 14B, a quadplexer of the eleventh variation of the first embodiment includes four filter chips 30 mounted on the upper surface of the multilayered substrate 10. As illustrated in FIG. 14C, a multiplexer of the twelfth variation of the first embodiment includes more than one filter chip 30 mounted on the upper surface of the multilayered substrate 10. As with in the first embodiment and its first through ninth variations, the shield layers 26 through 28 are formed in the multilayered substrate 10. Other structures are the same as those of the first embodiment and its first through ninth variations, and thus the description is omitted.

As described in the tenth through twelfth variations of the first embodiment, a triplexer, a quadplexer, or a multiplexer may have the shield layer.

As described above, in the first embodiment and its variations, an acoustic wave chip (e.g., the filter chips 30 and 32) including an acoustic wave element formed therein is mounted on the upper surface of the multilayered substrate 10. A first ground terminal (e.g., the ground foot pads FGr, FGt, and FGf) electrically coupled to the ground electrode of the acoustic wave chip (e.g., the ground electrode PG in FIG. 3A and FIG. 4A) is formed on the lower surface of the multilayered substrate 10. A signal terminal (e.g., the transmit foot pad FTx, the receive foot pad FRx, and the signal foot pad FS) electrically coupled to the signal electrode of the acoustic wave chip (e.g., the signal electrodes PS1 and PS2 in FIG. 3A and FIG. 4A) is formed on the lower surface of the multilayered substrate 10. The shield layers 26 through 28 are formed at least on the upper surface of the multilayered substrate 10, on the lower surface of the multilayered substrate, or between the lower surface and the upper surface so as to overlap with at least a part of the acoustic wave chip. In the present description, if one object overlaps with another object, at least a part of one object covers or is covered by at least a part of another object when transparently viewed from a direction perpendicular to the upper surface or the lower surface of the multilayered substrate. The shield layers 26 through 28 are coupled to the second ground terminal without electrically connecting to the first ground terminal in the multilayered substrate 10 and in the acoustic wave device. That is to say, the shield layers 26 through 28 are electrically separated from the first ground terminal.

This configuration allows the shield layers 26 through 28 to block the leakage of a high-frequency signal from the acoustic wave chip. Furthermore, since the shield layers 26 through 28 are not electrically coupled to the ground of the acoustic wave chip in the multilayered substrate 10 or in the acoustic wave device, the leakage of a high-frequency signal through the ground can be reduced.

The shield layers 26 through 28 have the apertures 35, and the first ground terminal and the acoustic wave chip are electrically interconnected through lines formed in the apertures 35 (e.g., the conductive layers 20 through 23 and the penetrating vias 16 through 18). This structure allows the shield layers 26 through 28 to have a large area, thereby further reducing the leakage of a high-frequency signal.

To reduce the leakage of a high-frequency signal from the acoustic wave chip, the distance between the lower surface of the acoustic wave chip and the upper surface of the shield layer is preferably small. For example, when the layers 11 through 13 of the multilayered substrate 10 have relative permittivities of approximately 4.9 to 9.0, the distance between the lower surface of the acoustic wave chip and the upper surface of the shield layer is preferably less than five times the wavelength of a high-frequency signal in the acoustic wave chip (e.g., the wavelength of the center frequency of a filter when the acoustic wave chip is a filter chip), and more preferably less than three times.

To reduce the distance between the lower surface of the acoustic wave chip and the upper surface of the shield layer, the shield layer 28 is preferably formed on the upper surface of the multilayered substrate 10. In this structure, at least one of the ground electrodes PGt, PGr, PGf (pad) is formed in the aperture 35. This structure allows the shield layer 28 to have a large area, and allows the shield layer 28 to be electrically separated from the ground electrodes PGt, PGr, and PGf.

The electrodes to be bonded to the chips 30 and 32 are formed on the upper surface of the multilayered substrate 10, and thus it is difficult to make the area of the shield layer 28 large. Thus, the shield layer 27 is preferably located on the upper side of the conductive layer 22 that is located uppermost among the conductive layers inside the multilayered substrate 10. This structure enables to make the area of the shield layer 27 large and to reduce the distances between the shield layer 27 and the chips 30 and 32.

When more than one acoustic wave chip is mounted, the shield layer is preferably formed so as to overlap with a region between the acoustic wave chips. This structure enables to reduce the leakage of a high-frequency signal between the acoustic wave chips. Moreover, when more than one acoustic wave chip is mounted, the shield layer may be formed so as to overlap with the acoustic wave chips. This structure also enables to reduce the leakage of a high-frequency signal between the acoustic wave chips.

Furthermore, when the acoustic wave chips are the transmit filter chip 30 and the receive filter chip 32, the leakage of a high-frequency signal from the transmit filter to the receive filter is reduced. Thus, the isolation characteristics from the transmit terminal to the receive terminal can be improved.

Second Embodiment

Figure 15:
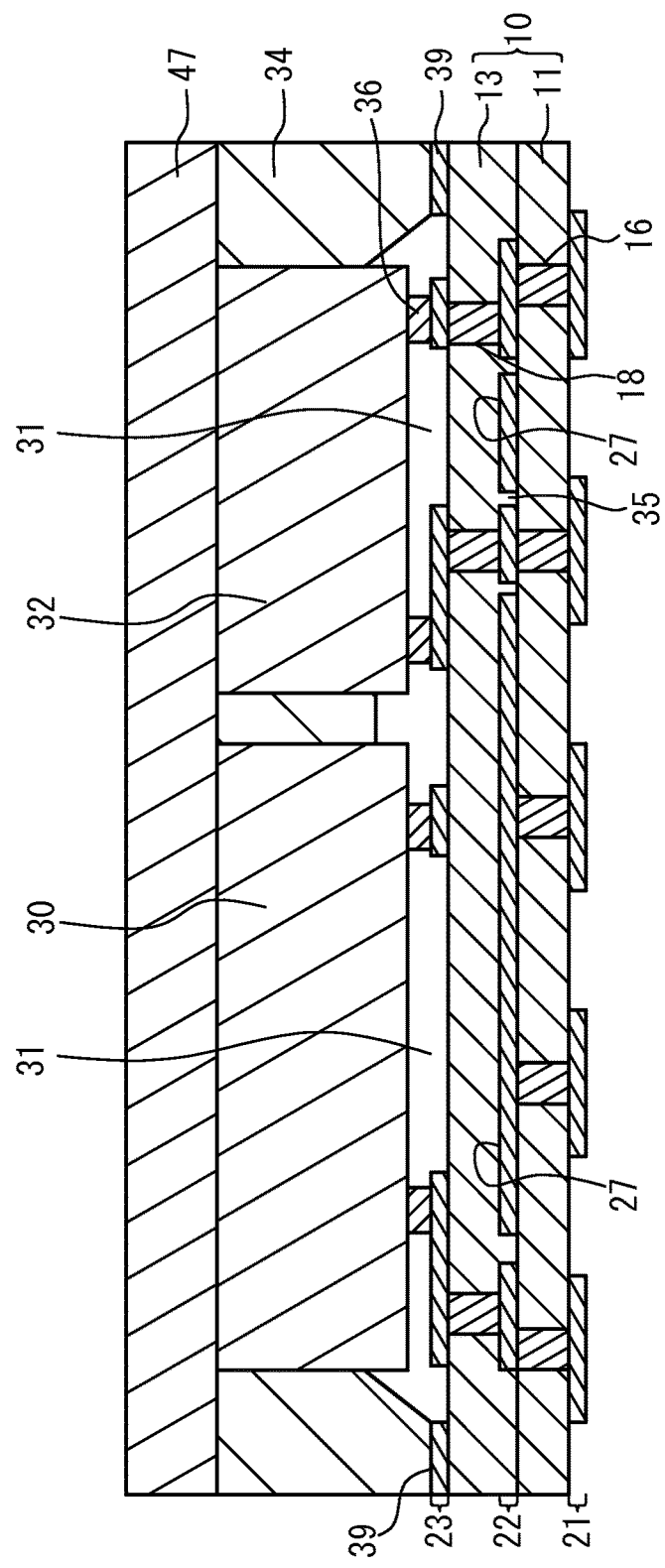
FIG. 15 is a cross-sectional view of a duplexer in accordance with a second embodiment.

A second embodiment simulated isolation characteristics of a duplexer. FIG. 15 is a cross-sectional view of a duplexer in accordance with the second embodiment. The multilayered substrate 10 includes the layers 11 and 13. The conductive layer 22 is located on the upper side of the layer 11, and the conductive layer 23 is located on the upper side of the layer 13. The conductive layer 21 is located on the lower side of the layer 11. On the multilayered substrate 10, flip-chip mounted are the transmit filter chip 30 and the receive filter chip 32 with use of the bumps 36. The transmit filter chip 30 and the receive filter chip 32 are sealed by the sealing portion 34 made of solder. A lid 47 is located on the upper surfaces of the transmit filter chip 30, the receive filter chip 32, and the sealing portion 34.

A transmit filter for Band 7 is formed in the transmit filter chip 30, and a receive filter for Band 7 is formed in the receive filter chip 32. The transmit band of Band 7 is from 2500 MHz to 2570 MHz, the receive band of Band 7 is from 2620 MHz to 2690 MHz. The transmit filter is a surface acoustic wave filter illustrated in FIG. 3A, and the receive filter is a piezoelectric thin film resonator filter illustrated in FIG. 4A.

Figure 16A:
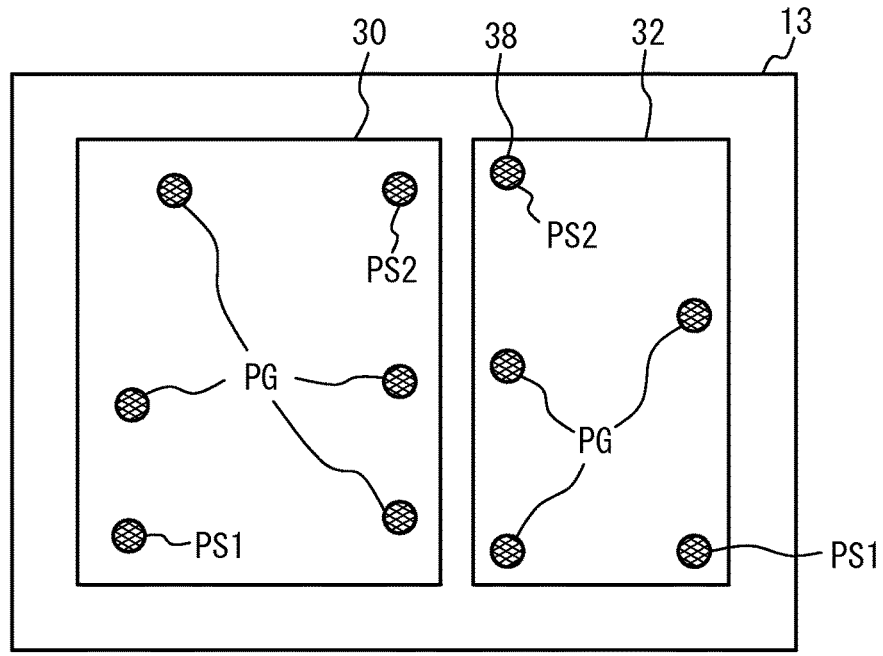
FIG. 16A and FIG. 16B are plan views (No. 1) of layers of a multilayered substrate in the second embodiment.
Figure 16B:
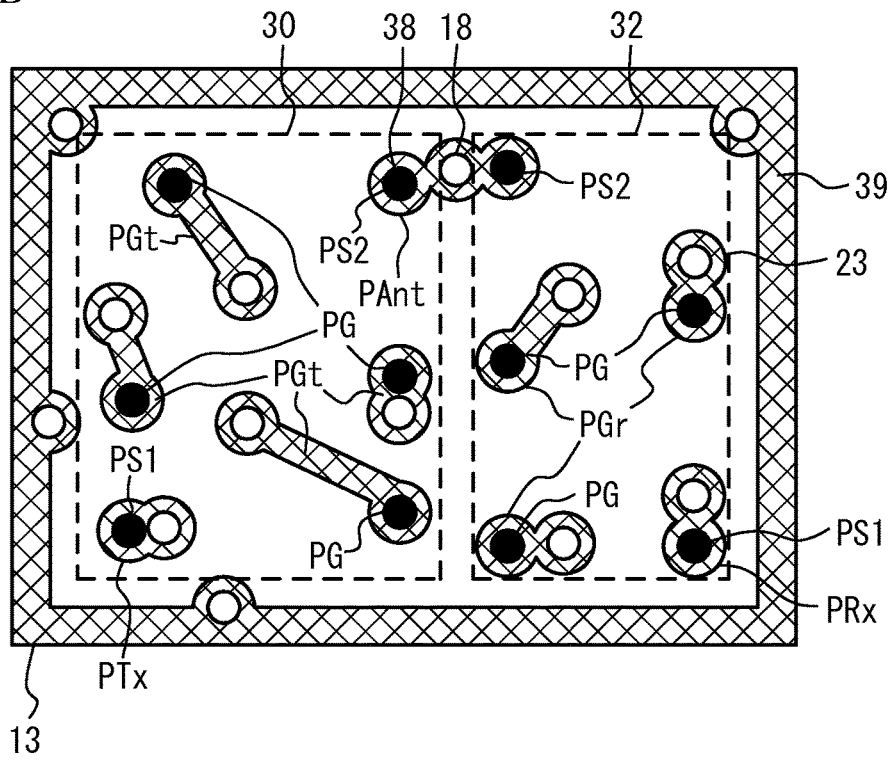
Figure 17A:
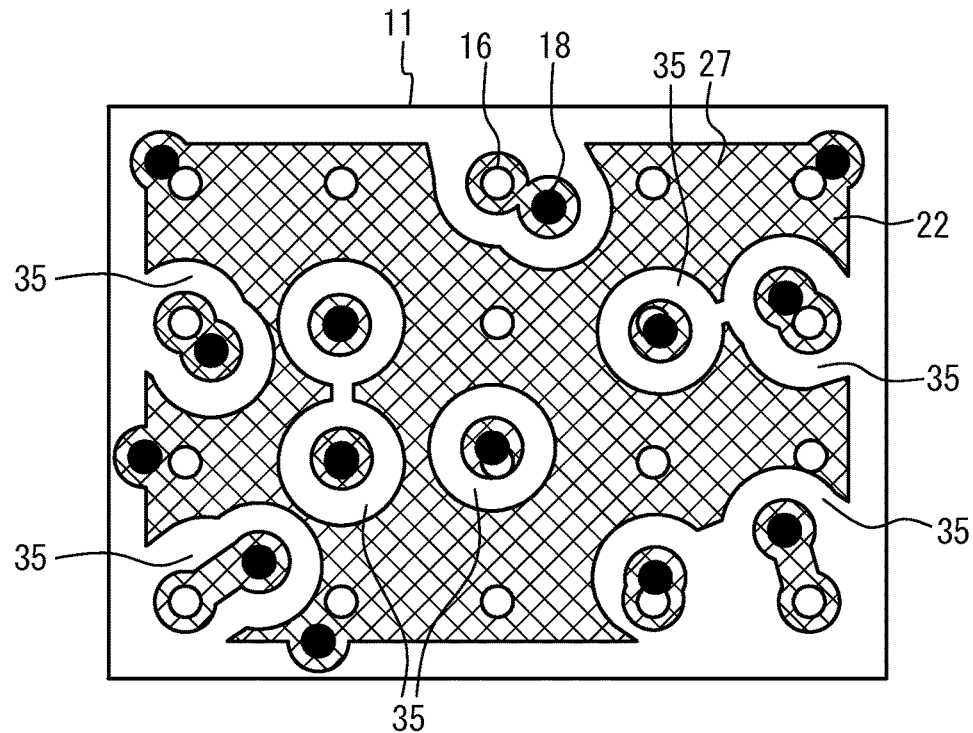
FIG. 17A and FIG. 17B are plan views (No. 2) of the layers of the multilayered substrate in the second embodiment.
Figure 17B:
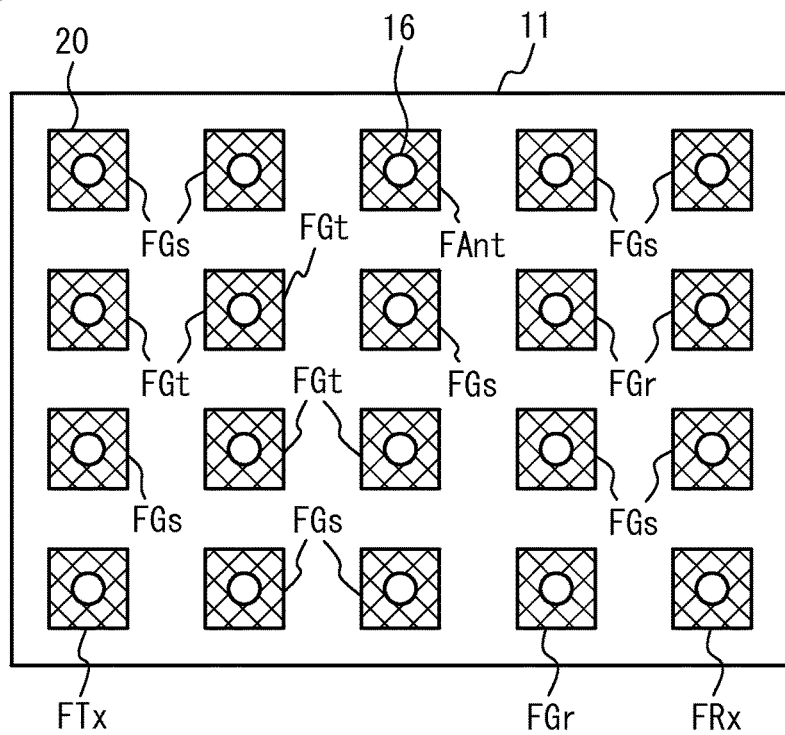

FIG. 16A through FIG. 17B are plan views of the layers of the multilayered substrate 10 in the second embodiment. FIG. 16A is a plan view of the electrodes 38 (indicated by cross hatching), and transparently illustrates the chips 30 and 32. FIG. 16B is a plan view of the upper side of the layer 13, and illustrates the conductive layer 23 by cross hatching, the electrodes 38 by black circles, and the penetrating vias 18 by open circles. FIG. 17A is a plan view of the upper side of the layer 11, and illustrates the conductive layer 22 by cross hatching, the penetrating vias 18 by black circles, and the penetrating vias 16 by open circles. FIG. 17B is a plan view of the lower side of the layer 11 transparently viewed from the above, and illustrates the conductive layer 20 by cross hatching, and the penetrating vias 16 by open circles.

As illustrated FIG. 16A, the transmit filter chip 30 and the receive filter chip 32 are mounted on the upper side of the layer 13. The electrodes 38 include the signal electrodes PS1, PS2 and the ground electrode PG. As illustrated in FIG. 16B, the conductive layer 23 is formed on the upper side of the layer 13. The conductive layer 23 includes the circular electrode 39, the transmit electrode PTx, the receive electrode PRx, the common electrode PAnt, and the ground electrodes PGt and PGr. The penetrating vias 18 are formed in the layer 13. The signal electrodes PS1, PS2 and the ground electrode PG of the transmit filter chip 30 are bonded to the transmit electrode PTx, the common electrode PAnt, and the ground electrode PGt, respectively. The signal electrodes PS1, PS2 and the ground electrodes PG of the receive filter chip 32 are bonded to the receive electrode PRx, the common electrode PAnt, and the ground electrodes PGr, respectively.

As illustrated in FIG. 17A, the conductive layer 22 is located on the upper side of the layer 11. The conductive layer 22 includes the shield layer 27 and lines connecting the penetrating vias 16 and 18. The apertures 35 are formed in the shield layer 27. The lines coupled to the transmit electrode PTx, the common electrode PAnt, the common electrode PAnt, and the ground electrodes PGt and PGr are formed in the apertures 35, and are not electrically coupled to the shield layer 27. In the present description, if one object is electrically coupled to another object, two conductive objects are electrically conducted with each other, and if one object is not electrically coupled to another object, two conductive objects are not electrically conducted with each other. The circular electrode 39 of FIG. 16B is electrically coupled to the shield layer 27 through the penetrating vias 18.

As illustrated in FIG. 17B, the conductive layer 20 is formed on the lower side of the layer 11. The conductive layer 20 includes foot pads. The penetrating vias 16 are coupled the corresponding foot pads. The transmit electrode PTx, the receive electrode PRx, the common electrode PAnt, and the ground electrodes PGt and PGr of FIG. 16B are electrically coupled to the transmit foot pad FTx, the receive foot pad FRx, the common foot pad FAnt, and the ground foot pads FGt and FGr through the penetrating vias 16 and 18, respectively. The shield layer 27 is electrically coupled to the ground foot pads FGs through the penetrating vias 16.

As described above, the ground electrodes PG of the transmit filter chip 30 and the receive filter chip 32 are not electrically coupled to the shield layer 27 in the multilayered substrate 10 or in the acoustic wave device. The ground foot pads FGt and FGr electrically coupled to the ground electrodes PG and the ground foot pads FGs electrically coupled to the shield layer 27 are electrically separated from each other, and individually formed.

Figure 18A:
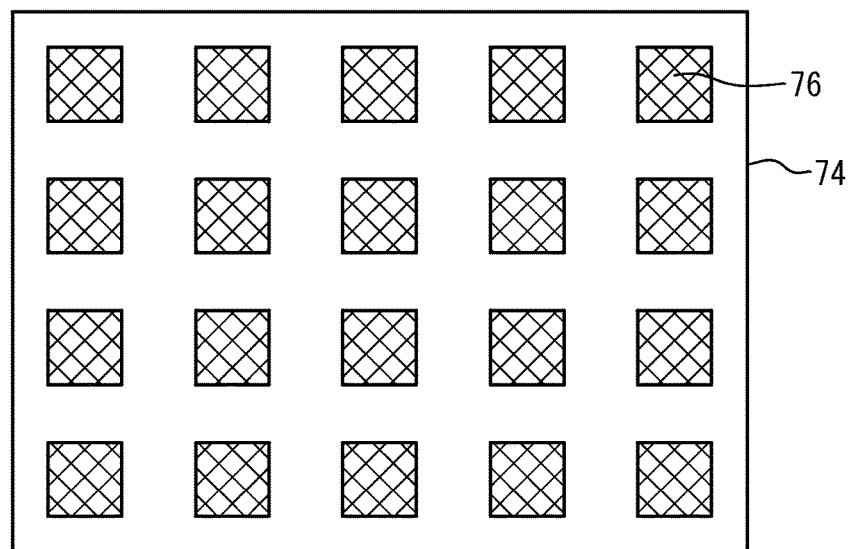
FIG. 18A and FIG. 18B are plan views illustrating an exemplary mounting board on which the duplexer of the second embodiment is mounted.
Figure 18B:
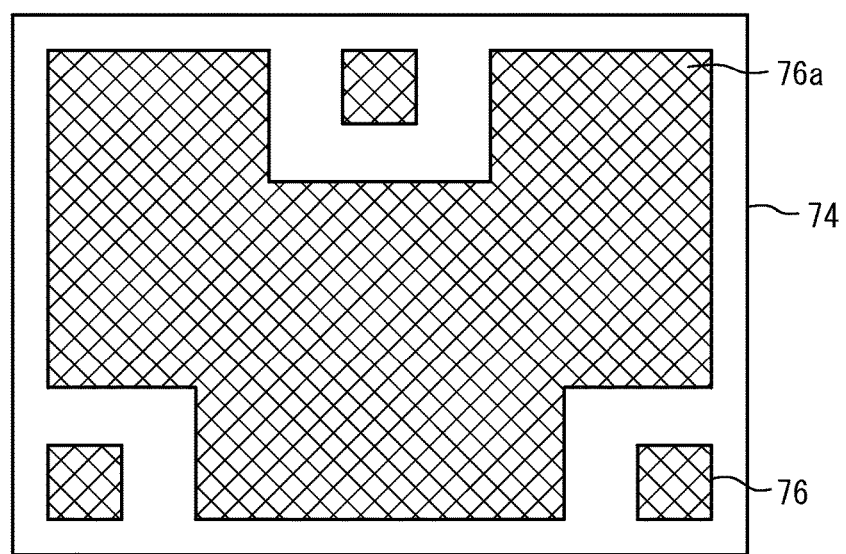

FIG. 18A and FIG. 18B are plan views illustrating a mounting board on which the duplexer of the second embodiment is to be mounted. As illustrated in FIG. 18A, the terminals 76 are formed on the upper surface of the mounting board 74. The foot pads of FIG. 17B are bonded to the corresponding terminals 76. The ground foot pads FGt and FGr and the ground foot pads FGs are electrically coupled to a common ground in the mounting board 74.

As illustrated in FIG. 18B, a ground terminal 76a is formed on the upper surface of the mounting board 74. The ground foot pads FGt and FGr corresponding to first ground terminals and the ground foot pads FGs corresponding to a second ground terminal are bonded to the ground terminal 76a, and electrically interconnected through the ground terminal 76a of the mounting board.

Figure 19:
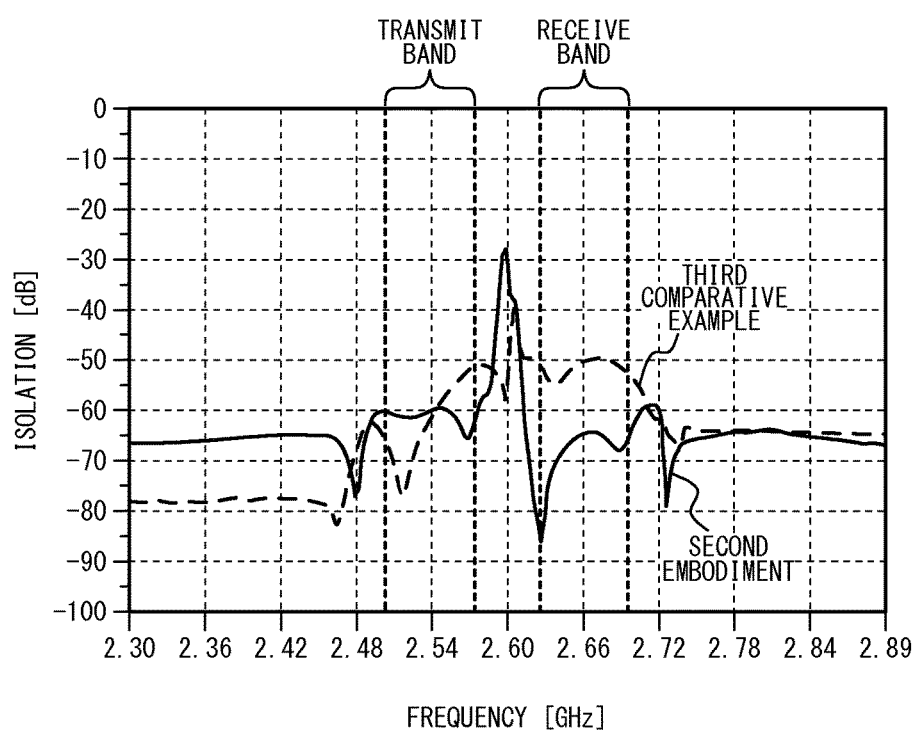
FIG. 19 is a diagram illustrating isolation characteristics of the second embodiment and a third comparative example.

FIG. 19 is a diagram illustrating isolation characteristics of the second embodiment and a third comparative example. The third comparative example fails to provide the shield layer 27 and the ground foot pad FGs. As illustrated in FIG. 19, the second embodiment improves the worst isolation values (i.e., minimum isolation values) in the transmit band and the receive band compared to the third comparative example.

In the second embodiment, the shield layer 27 and the ground terminals FGt and FGr are not electrically interconnected in the multilayered substrate 10 or in the acoustic wave device. This structure improves the isolation characteristics. To improve the isolation characteristics, the shield layer is preferably located near the chips 30 and 32. For example, it may be considered to form a shield layer with the conductive layer 23 on the upper side of the layer 13. However, pads to be bonded to the electrodes 38 of the chips 30 and 32 and the circular electrode 39 are formed on the upper side of the layer 13. Thus, the area of the shield layer is small. To address this problem, the shield layer 27 is formed with the uppermost conductive layer 22 among the conductive layers except the conductive layer 23. This structure enables to make the area of the shield layer 27 large, and to reduce the distances between the shield layer 27 and the chips 30 and 32. Furthermore, the apertures 35 are formed in the shield layer 27, and the lines connecting the chips 30 and 32 to the ground foot pads FTx and FRx are formed in the apertures 35. This structure enables to make the area of the shield layer 27 larger. Accordingly, the isolation characteristics can be improved as illustrated in FIG. 19.

Third Embodiment

Figure 20:
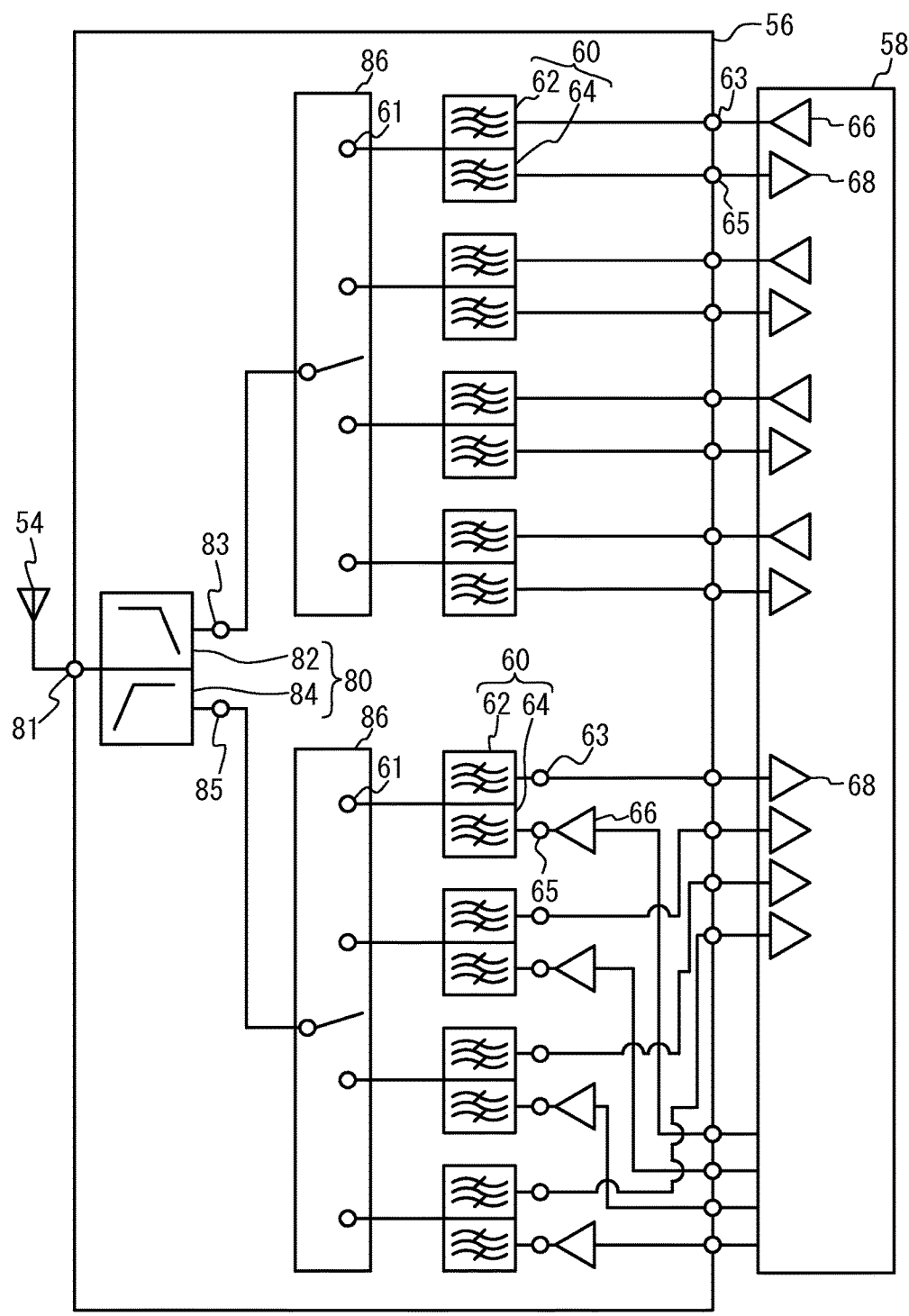
FIG. 20 is a block diagram of a mobile communication device in accordance with a third embodiment.

A third embodiment is an exemplary mobile communication device including any one of the duplexers of the first embodiment, the second embodiment, and their variations. FIG. 20 is a block diagram of a mobile communication device in accordance with the third embodiment. As illustrated in FIG. 20, the mobile communication device includes a module 56 that is a transceiver device, an integrated circuit 58, and an antenna 54. The module 56 includes a diplexer 80, switches 86, duplexers 60, and power amplifiers 66. The diplexer 80 includes a low-pass filter (LPF) 82 and a high-pass filter (HPF) 84. The LPF 82 is connected between terminals 81 and 83. The HPF 84 is connected between terminals 81 and 85. The terminal 81 is coupled to the antenna 54. The LPF 82 passes signals with lower frequency of high-frequency signals transmitted and received by the antenna 54, and suppresses signals with higher frequency. The HPF 84 passes signals with higher frequency of signals transmitted and received by the antenna 54, and suppresses signals with lower frequency.

The switch 86 connects the terminal 83 to one of terminals 61. The duplexer 60 includes a transmit filter 62 and a receive filter 64. The transmit filter 62 is connected between terminals 61 and 63. The receive filter 64 is connected between terminals 61 and 65. The transmit filter 62 passes high-frequency signals in the transmit band, and suppresses other high-frequency signals. The receive filter 64 passes high-frequency signals in the receive band, and suppresses other high-frequency signals. The power amplifier 66 amplifies and outputs transmission signals to the terminal 63. A low noise amplifier 68 amplifies and outputs reception signals to the terminal 65.

The module 56 that is a transceiver device has the duplexer or the filter of the first embodiment, the second embodiment, or their variations as the duplexer 60, or the filter 62 or 64. The module 56 may include the power amplifier 66 and/or the low noise amplifier 68. A mobile terminal device has the module 56.

As described above, the acoustic wave device of the first embodiment, the second embodiment, or their variations can be coupled to the antenna 54, and mounted on a motherboard together with the power amplifier 66 and other elements to form a transceiver device capable of transmitting or receiving communication signals. Furthermore, the transceiver device is installed in the mobile communication device to enable to achieve communication with low noise.

Although the embodiments of the present invention have been described in detail, it is to be understood that the various change, substitutions, and alterations could be made hereto without departing from the spirit and scope of the invention.

What is claimed is:

1. An acoustic wave device comprising:
   one or more acoustic wave chips each including an acoustic wave element formed therein, each of the one or more acoustic wave chips having a ground electrode;
   a multilayered substrate having the one or more acoustic wave chips mounted on an upper surface thereof;
   one or more first ground terminals formed on a lower surface of the multilayered substrate and each electrically coupled to the ground electrode of the corresponding acoustic wave chip;
   a second ground terminal formed on the lower surface of the multilayered substrate;
   one or more signal terminals formed on the lower surface of the multilayered substrate and each electrically coupled to a signal electrode of the corresponding acoustic wave chip; and
   a shield layer formed at least one of on the upper surface of the multilayered substrate, on the lower surface of the multilayered substrate, and on a layer between the lower surface and the upper surface of the multilayered substrate so as to overlap with at least a part of the one or more acoustic wave chips, wherein the shield layer is not electrically coupled to any of the ground electrodes of the one or more acoustic wave chips, and is electrically coupled to the second ground terminal.

2. The acoustic wave device according to claim 1, wherein the shield layer includes an aperture, and the one or more first ground terminals are respectively electrically coupled to the one or more acoustic wave chips through a line formed in the aperture.

3. The acoustic wave device according to claim 1, wherein the shield layer is formed on the upper surface of the multilayered substrate.

4. The acoustic wave device according to claim 1, wherein the shield layer is formed in an uppermost conductive layer among conductive layers formed inside the multilayered substrate.

5. The acoustic wave device according to claim 1, wherein the one or more acoustic wave chips include two acoustic wave chips, and the shield layer is formed so as to overlap a region between said two acoustic wave chips.

6. The acoustic wave device according to claim 1, further comprising:

a circular electrode formed on the upper surface of the multilayered substrate and surrounding the one or more acoustic wave chips, wherein the circular electrode is electrically coupled to the shield layer in the multilayered substrate.

7. The acoustic wave device according to claim 1, wherein the one or more acoustic wave chips include a transmit filter chip including a transmit filter formed therein and a receive filter chip including a receive filter formed therein, the one or more signal terminals include a transmit terminal, a receive terminal, and a common terminal, the transmit filter is electrically connected between the common terminal and the transmit terminal, and the receive filter is electrically connected between the common terminal and the receive terminal.

8. A transceiver device comprising:

a mounting board; and the acoustic wave device according to claim 1, wherein the one or more first ground terminals and the second ground terminal are individually coupled to a ground of the mounting board.

9. A mobile communication device comprising:

the transceiver device according to claim 8.

10. An acoustic wave device comprising:

an acoustic wave chip including an acoustic wave element formed therein;

a multilayered substrate having the acoustic wave chip mounted on an upper surface thereof;

a first ground terminal formed on a lower surface of the multilayered substrate and electrically coupled to a ground electrode of the acoustic wave chip;

a second ground terminal formed on the lower surface of the multilayered substrate;

a signal terminal formed on the lower surface of the multilayered substrate and electrically coupled to a signal electrode of the acoustic wave chip;

a shield layer formed at least one of on the upper surface of the multilayered substrate, on the lower surface of the multilayered substrate, and on a layer between the lower surface and the upper surface of the multilayered substrate so as to overlap with at least a part of the acoustic wave chip, wherein the shield layer is not electrically coupled to the first ground terminal in the multilayered substrate, and is electrically coupled to the second ground terminal; and a pad formed on the upper surface of the multilayered substrate and bonded to the ground electrode, wherein the shield layer is formed on the upper surface of the multilayered substrate, the shield layer includes an aperture, and the pad is formed in the aperture.

11. An acoustic wave device comprising:

an acoustic wave chip including an acoustic wave element formed therein;

a multilayered substrate having the acoustic wave chip mounted on an upper surface thereof;

a first ground terminal formed on a lower surface of the multilayered substrate and electrically coupled to a ground electrode of the acoustic wave chip;

a second ground terminal formed on the lower surface of the multilayered substrate;

a signal terminal formed on the lower surface of the multilayered substrate and electrically coupled to a signal electrode of the acoustic wave chip; and a shield layer formed at least one of on the upper surface of the multilayered substrate, on the lower surface of the multilayered substrate, and on a layer between the lower surface and the upper surface of the multilayered substrate so as to overlap with at least a part of the acoustic wave chip, wherein the shield layer is not electrically coupled to the first ground terminal in the multilayered substrate, and is electrically coupled to the second ground terminal, wherein the acoustic wave chip includes acoustic wave chips, and the shield layer is formed so as to overlap with the acoustic wave chips.

* * * * *